(12) United States Patent
Majerus

(10) Patent No.: US 11,361,830 B2
(45) Date of Patent: Jun. 14, 2022

(54) ADJUSTING READ VOLTAGE LEVELS BASED ON A PROGRAMMED BIT COUNT IN A MEMORY SUB-SYSTEM

(71) Applicant: Micron Technology, Inc., Boise, ID (US)

(72) Inventor: Douglas E. Majerus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/822,561

(22) Filed: Mar. 18, 2020

(65) Prior Publication Data
US 2021/0295928 A1  Sep. 23, 2021

(51) Int. Cl.
| G11C 16/26 | (2006.01) |
| G11C 16/12 | (2006.01) |
| G11C 16/34 | (2006.01) |
| G11C 16/30 | (2006.01) |
| G11C 16/14 | (2006.01) |

(52) U.S. Cl.
CPC .............. *G11C 16/26* (2013.01); *G11C 16/12* (2013.01); *G11C 16/14* (2013.01); *G11C 16/30* (2013.01); *G11C 16/349* (2013.01)

(58) Field of Classification Search
CPC ..................................................... G11C 16/26
See application file for complete search history.

(56) References Cited

U.S. PATENT DOCUMENTS

| 2008/0175055 | A1* | 7/2008 | Kim | ................... G11C 16/3418 365/185.11 |
| 2008/0181012 | A1* | 7/2008 | Richter | .................. G11C 16/10 365/185.21 |
| 2011/0128790 | A1 | 6/2011 | Sarin et al. | |
| 2016/0225439 | A1 | 8/2016 | Kim | |
| 2016/0307615 | A1 | 10/2016 | Andre et al. | |
| 2017/0287568 | A1 | 10/2017 | Yang et al. | |
| 2020/0211662 | A1* | 7/2020 | Cariello | ................ G06F 3/0604 |

FOREIGN PATENT DOCUMENTS

KR     10-1434404 B1     8/2014

OTHER PUBLICATIONS

International Search Report and Written Opinion for PCT Patent Application No. PCT/US2021/022828, dated Mar. 17, 2021, 9 pages.

\* cited by examiner

*Primary Examiner* — Douglas King
(74) *Attorney, Agent, or Firm* — Lowenstein Sandler LLP

(57) ABSTRACT

A target value of programmed bits is established for each programming distribution of a set of programming distributions of a memory sub-system. A read voltage level is applied to determine a measured value of programmed bits in one or more programming distributions of the set of programming distributions. The target value of programmed bits is compared to the measured value of programmed bits to determine a comparison result and an action is executed in view of the comparison result.

18 Claims, 7 Drawing Sheets

ADJUSTING READ VOLTAGE LEVELS BASED ON A PROGRAMMED BIT COUNT IN A MEMORY SUB-SYSTEM

TECHNICAL FIELD

Embodiments of the disclosure relate generally to memory sub-systems, and more specifically, relate to adjusting read voltage levels based on a programmed bit count in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
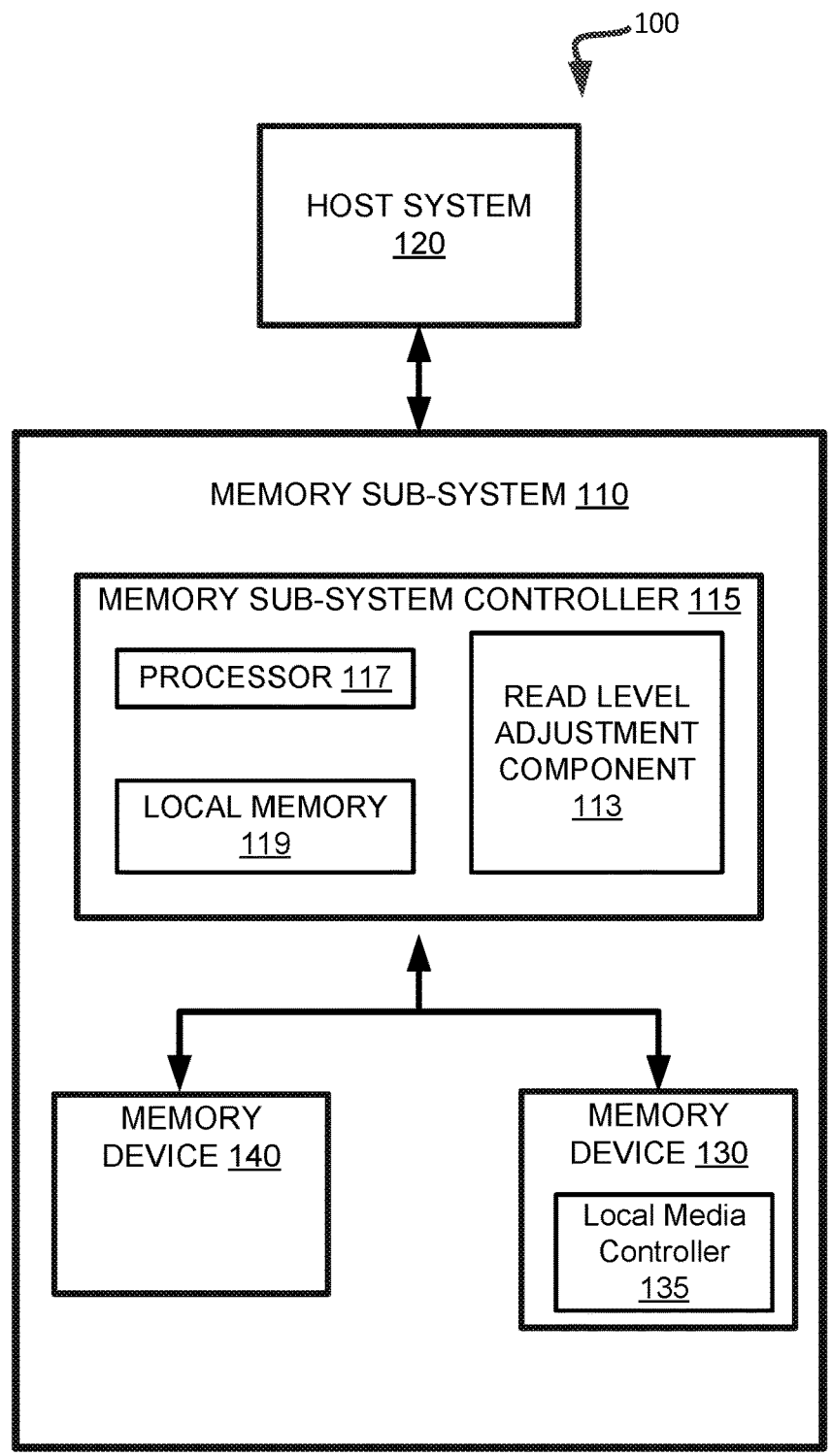
FIG. 1 illustrates an example computing system that includes a memory sub-system in accordance with some embodiments of the present disclosure.

Aspects of the present disclosure are directed to adjusting read levels based on a programmed bit count in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include multiple memory devices having one or more arrays of memory cells to store data. A cell is an electronic circuit that stores information. Depending on the cell type, a cell can store one or more bits of binary information, and has various logic states that correlate to the number of bits being stored. The logic states can be represented by binary values, such as "0" and "1", or combinations of such values. A memory device can be made up of bits arranged in a two-dimensional grid. Memory cells are etched onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell. A block hereinafter refers to a unit of the memory device used to store data and can include a group of memory cells, a word line group, a word line, or individual memory cells.

The memory device can store an amount of charge into the memory cells based on a programming level voltage or threshold voltage (Vt) corresponding to multiple programming distributions associated with respective data values. The memory device can read or determine data values stored in the memory cells using a read level voltage (also referred to as a "read level") corresponding to the threshold voltage for each programming distribution of the memory cell.

However, as memory cells undergo programming, sensing, and erase cycles over time, the threshold voltage corresponding to a programming distribution of the memory cells can change, which can result in an erroneous reading of the memory cell. That is, the determined state of a memory cell during a read operation performed on the memory cell can be a state other than the state to which the memory cell was programmed.

Aspects of the present disclosure address the above and other deficiencies by having a memory sub-system that includes a feedback system to dynamically adjust to changes in read level threshold voltages corresponding to programming distributions of the memory sub-system. During a programming process, the system establishes a fixed or target ratio of programmed bits to erased bits for each programming distribution (herein referred to as the "target ratio of programmed bits") of the memory device. The target ratio of programmed bits can include a substantially equal number of programmed bits in each of the programming distributions (e.g., for an MLC memory device having four programming distributions, the target ratio of programming bits for each distribution can be one-quarter.

During a read operation, a read voltage level associated with a distribution state is applied and a summation function is executed to determine or measure a cumulative or total number of programmed bits corresponding to the applied read voltage level. The measured total number of programmed bits is used to identify a measured ratio of programmed bits which is compared to the target ratio of programmed bits to produce a comparison result. The comparison result is used by the system as a signal to drive the applied read voltage level to a target read voltage level. For example, using the comparison result, the system can adjust (e.g., increase or decrease) the applied read voltage level to establish the target read voltage level for execution of the read operation.

Advantageously, the system according to embodiments of the present disclosure eliminates the need to implement costly calibration algorithms to continuously predict read levels within the memory device. This results in a more efficient read path resulting in an improved trigger rate (i.e., a rate at which the device error correction fails and requires additional corrective reads to return the requested data). Furthermore, a target read level corresponding to each of the programming distributions are individually tuned to reflect a desired convergence based on the bit signal. Advantages of the present disclosure further include establishing optimum read values in the execution of read processing without adding additional latency. Furthermore, since the read operations are internally calibrated using the feedback system within each read, movement in read levels (e.g., due to disturb mechanisms) are tracked. Accordingly, no additional calibration scheme is required to predict changes in threshold voltage levels due to operational or environmental related wear or changes over times.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative- and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read level adjustment component 113 that can be used to adjust to a target read voltage level value in view of a number of programmed bits (or bitlines) in each programming distribution of a memory device. In an embodiment, during a write or program process, the read level adjustment component 113 establishes a target value of programmed bits for each programming distribution state. In an embodiment, the target value is based on a ratio of programmed bits to erased bits for each programming distribution state of any type of memory sub-system (e.g., SLC memory devices, MLC memory devices, QLC memory devices, etc.). In one example, for an MLC memory sub-system having four programming distributions, the target value or ratio can be established such that each programming distribution includes one-quarter of the total number of programmed bits.

During a read operation, the read level adjustment component 113 applies an initial read voltage level to determine a measured value of programmed bits in a programming distribution. In an embodiment, the measured value can be based on a ratio of programming bits to erased bits for a programming distribution. The read level adjustment component 113 can execute a summation function to measure a count of programmed bits and the corresponding measured ratio of programmed bits. The measured value of programmed bits is compared to the target value of programmed bits to determine a comparison result. In view of the comparison result, the read level adjustment component 113 executes a corresponding action. In an embodiment, if the comparison result indicates that the measured value of programmed bits is substantially equal (e.g., within a predefined tolerance or range) to the target value of programmed bits, the read level adjustment component 113 executes the read operation and reads the data using the applied read voltage level. In an embodiment, if the comparison result indicates that the measured value of programmed bits is greater than the target value of programmed bits, then the read level adjustment component 113 decreases the applied read voltage level to an adjusted read voltage level. In an embodiment, if the comparison result indicates that the measured value of programmed bits is less than the target value of programmed bits, then the read level adjustment component 113 increases the applied read voltage level to an adjusted read voltage level. The read level adjustment component 113 can iteratively apply an adjusted read voltage level until the measured value of programmed bits is substantially equal (e.g., within a tolerance or threshold) to the target value of programmed bits.

Figure 2:
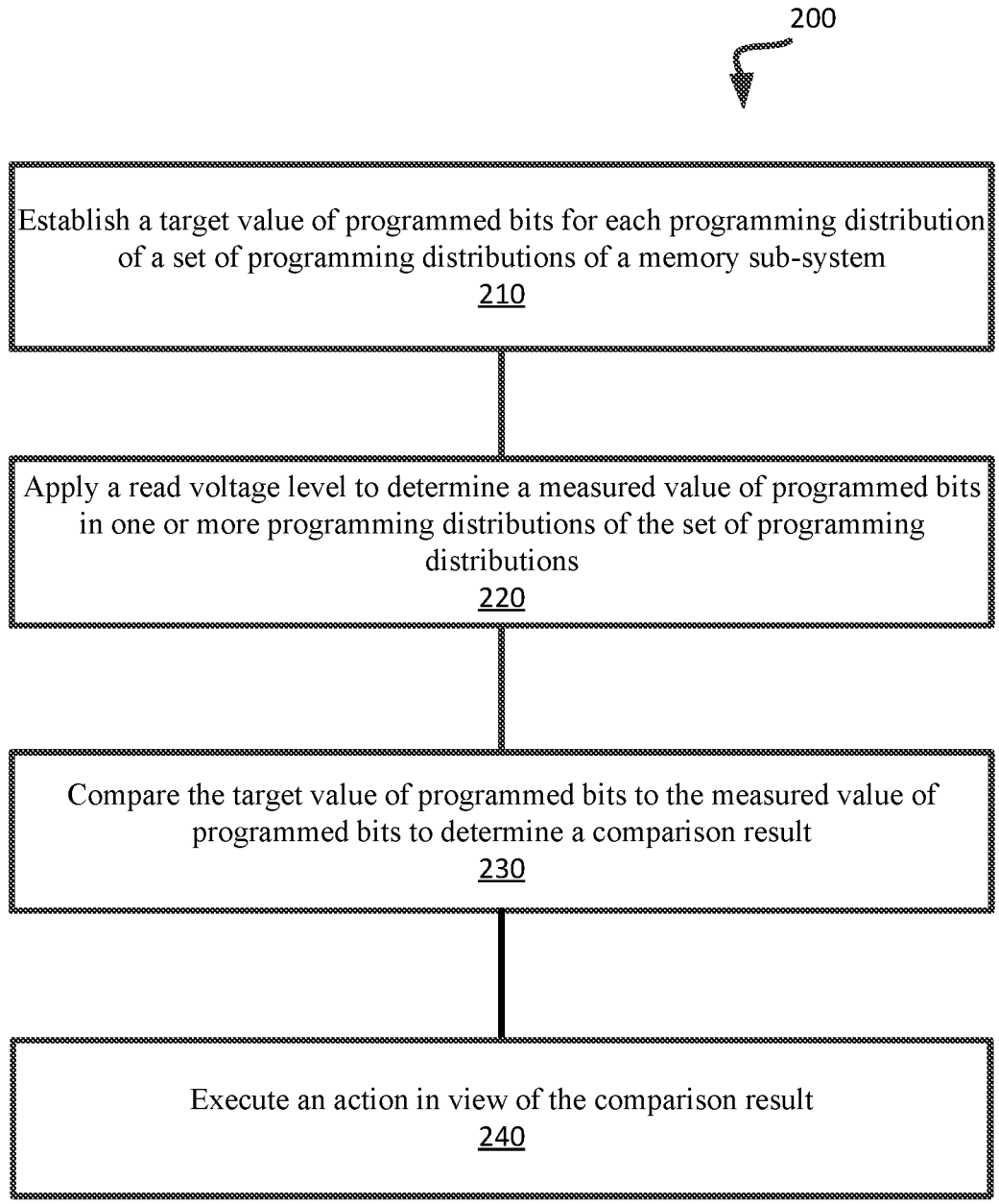
FIG. 2 is a flow diagram of an example method to manage a read voltage level in view of comparison of a measured value of programmed bits in a programming distribution to a target value of programmed bits in the programming distribution in accordance with some embodiments.

FIG. 2 is a flow diagram of an example method 200 to manage read voltage levels during execution of a read operation to read data in a memory device. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read level adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic establishes a target value of programmed bits for each programming distribution of a set of programming distributions of a memory sub-system. In an embodiment, the target value of programmed bits can be a ratio of programmed bits to erased or erased bits of a programming distribution. In an embodiment, the target value of programmed bits corresponding to each of the programming distributions can be established during a program time of the memory sub-system.

Figure 3:
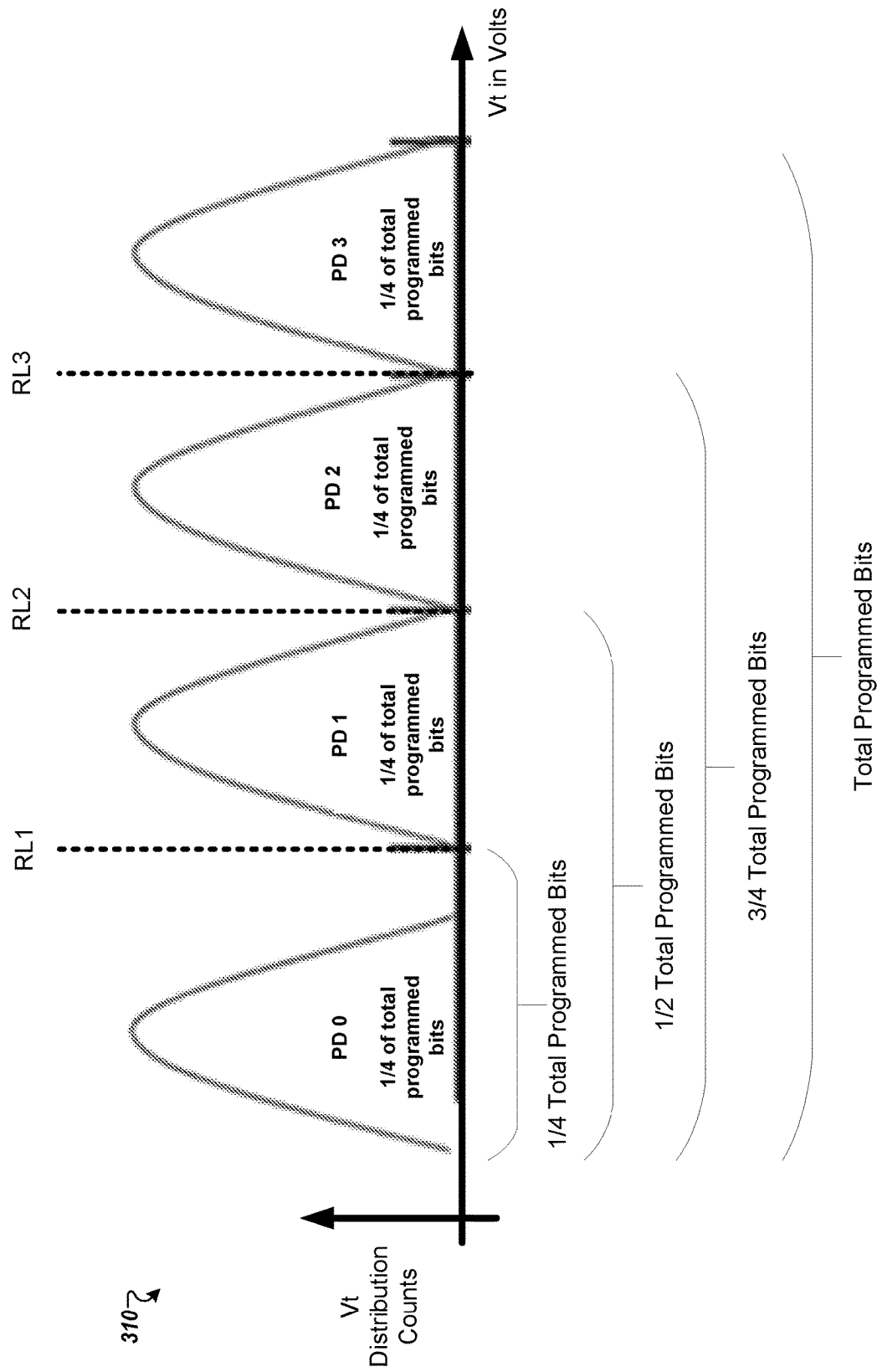
FIG. 3 illustrates an example set of programming distributions of an example memory device having target values of programmed bits established by a read level adjustment component in accordance with some embodiments.

For example, for a MLC memory device having four programming distributions, the processing logic can establish a target value of programmed bits where each of the four programming distributions includes one-quarter of the programmed bits. FIG. 3 illustrates an example set of programming distributions 210 (e.g., programming distribution (PD) 0, PD 1, PD 2, and PD 3) of an example MLC memory device having a target value of programmed bits established by a read level adjustment component 113 (e.g., in accordance with operation 210 of process 200 shown in FIG. 2). As illustrated, during a programming process, a target value of programmed bits for each of the programming distributions (PD 0, PD 1, PD 2, and PD 3) is established. In this example, each of the four programming distributions can be programmed to include one-quarter of the total number of the programmed bits.

At operation 220, the processing logic applies a read voltage level to determine a measured value of programmed bits corresponding to one or more programming distribution of the set of programming distributions. In an embodiment, the measure value can be a ratio of programmed bits to erased bits in the programming distribution. In an embodiment, the measured value can be determined by executing a summation function to sum or count a total number of programmed bitlines corresponding to the programming distribution. Application of the read voltage level and summation of the measure value of programmed bits is described in greater detail below with respect to FIG. 4. For example, as shown in FIG. 3, a read voltage level (RL2) can be applied to determine or measure a number of programmed bits of programming distribution 1 (PD 1). As shown in FIG. 3, the target value of programmed bits associated with PD 1 is one-half of the total number of programmed (e.g., readable) bits.

At operation 230, the processing logic compares the target value of programmed bits to the measured value of programmed bits to determine a comparison result. In an embodiment, the comparison can be made between a target ratio of programmed bits to erased bits for a programming distribution to a measured ratio of programmed bits to erased bits for the programming distribution.

At operation 240, the processing logic executes an action in view of the comparison result. In an embodiment, the action can include executing the read operation using the applied read level voltage in response to determining the comparison result indicates the measured value of programmed bits is substantially equal to the target value of programmed bits. In an embodiment, the measured value of programmed bits is determined to be substantially equal to the target value of programmed bits if the two values are equal or within a predetermined tolerance or range. In an embodiment, the action can include decreasing the applied read voltage level to an adjusted read voltage level in response to determining the comparison result indicates the measured value of programmed bits is greater than the target value of programmed bits. In an embodiment, the action can include increasing the applied read voltage level to an adjusted read voltage level in response to determining the comparison result indicates the measured value of programmed bits is less than the target value of programmed bits.

In an embodiment, operations 220, 230, and 240 can be performed iteratively each time an adjusted read voltage level is generated. In this regard, the adjusted read voltage level is applied to determine an updated measured value of programmed bits (as in operation 220) to be compared to the target value of programmed bits (in operation 230) until the comparison result indicates the updated measured value of programmed bits is substantially equal to the target value of programmed bits.

Figure 4:
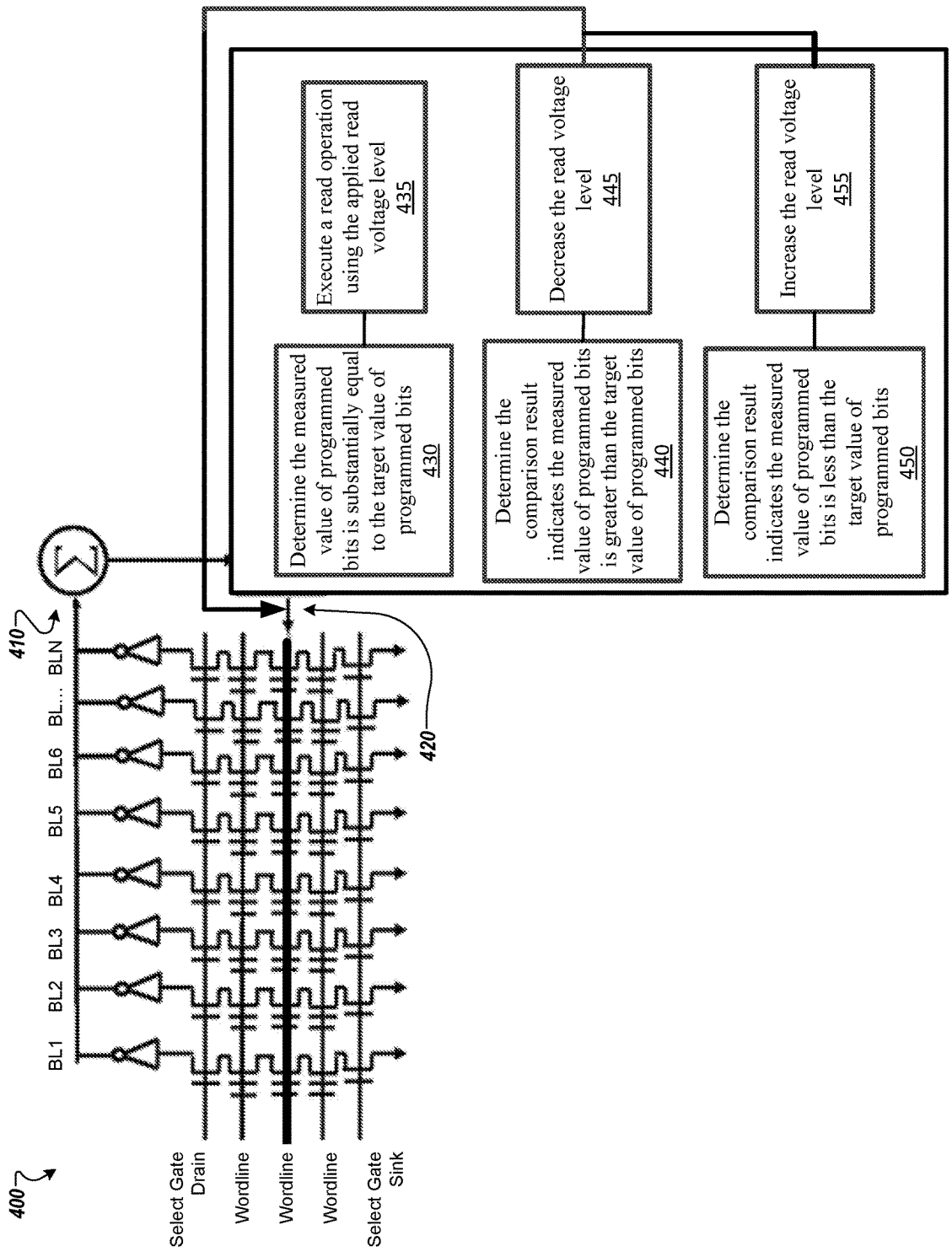
FIG. 4 illustrates an example circuit diagram corresponding to an example read level adjustment component and corresponding functionality in accordance with some embodiments.

FIG. 4 illustrates an example circuit diagram 400 corresponding to an example read level adjustment component 113 of the present application. A read voltage level is applied to a word line of the memory device 420 and a summation function 410 is executed to determine a count of the number of programmed bitlines (e.g., BL1, BL2, BL3 . . . BLN). The summation or cumulative value is used by the read level adjustment component 113 to determine a measured value of programmed bits (e.g., the number of programmed bitlines) and compare it to a target value of programmed bits. At 430, the read voltage adjustment component 113 can determine the measured value of programmed bits is substantially equal to the target value of programmed bits. Based on this comparison result, the read voltage adjustment component 113 executes the read operation using the applied read voltage level at 435.

In an embodiment, at 440, the read voltage adjustment component 113 can determine the measured value of programmed bits is greater than the target value of programmed bits. Based on this comparison result, the read voltage adjustment component 113 decreases the applied read voltage level to an adjusted (decreased) read voltage level at 445. The adjusted read voltage level is fed back and applied to the word line at 420 and the summation operation is repeated to identify an updated measured value of programmed bits.

In an embodiment, at 450, the read voltage adjustment component 113 can determine the measured value of programmed bits is less than the target value of programmed bits. Based on this comparison result, the read voltage adjustment component 113 increases the applied read voltage level to an adjusted (decreased) read voltage level at 455. The adjusted read voltage level is fed back and applied to the word line at 420 and the summation function is repeated to identify an updated measured value of programmed bits.

Figure 5:
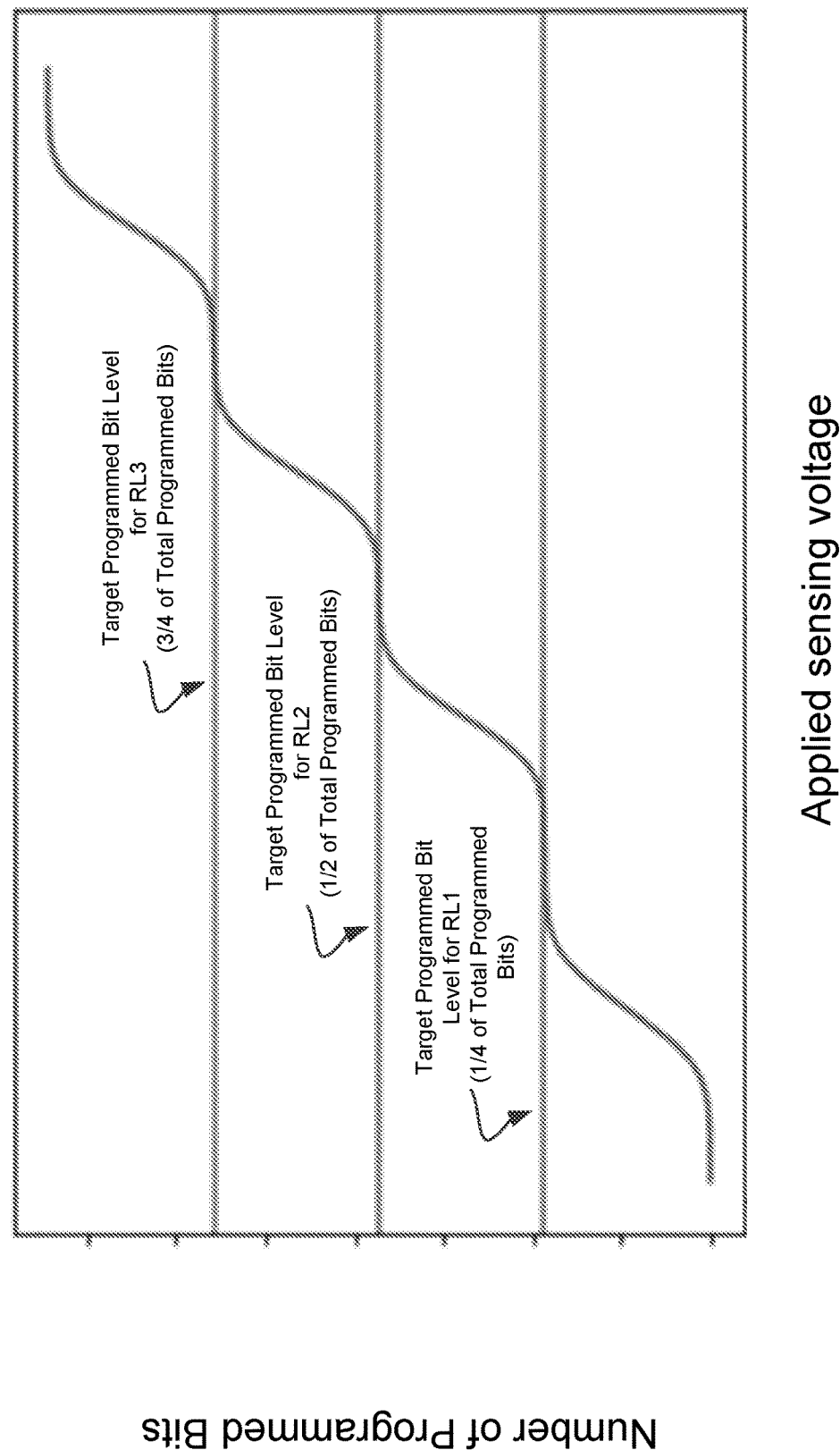
FIG. 5 is a graph illustrating a plot of a number of programmed bits corresponding to an applied sensing voltage level in accordance with some embodiments.

FIG. 5 is a graph illustrating a plot of a number of programmed bits in an independent bitline setup with a common applied measurement voltage. As shown, the read voltage level adjustment component can use the comparison result to drive the read threshold levels (e.g., RL1, RL2, and RL3) to a value where the measure value of programmed bits is substantially equal to the target value of programmed bits. As shown, the target value of programmed bits (or target programmed bit level) is established and corresponding to a valley between adjacent programming distributions. Advantageously, by executing an action in view of the comparison result, an applied read voltage level can adjusted and locked in when the target value of programmed bits is achieved. In the example shown in FIG. 5, the target programmed bit level for RL1 is one-quarter of the total programmed bits, the target programmed bit level for RL2 is one-half of the total programmed bits, and the target programed bit level for RL3 is three-quarters of the total programmed bits.

Figure 6:
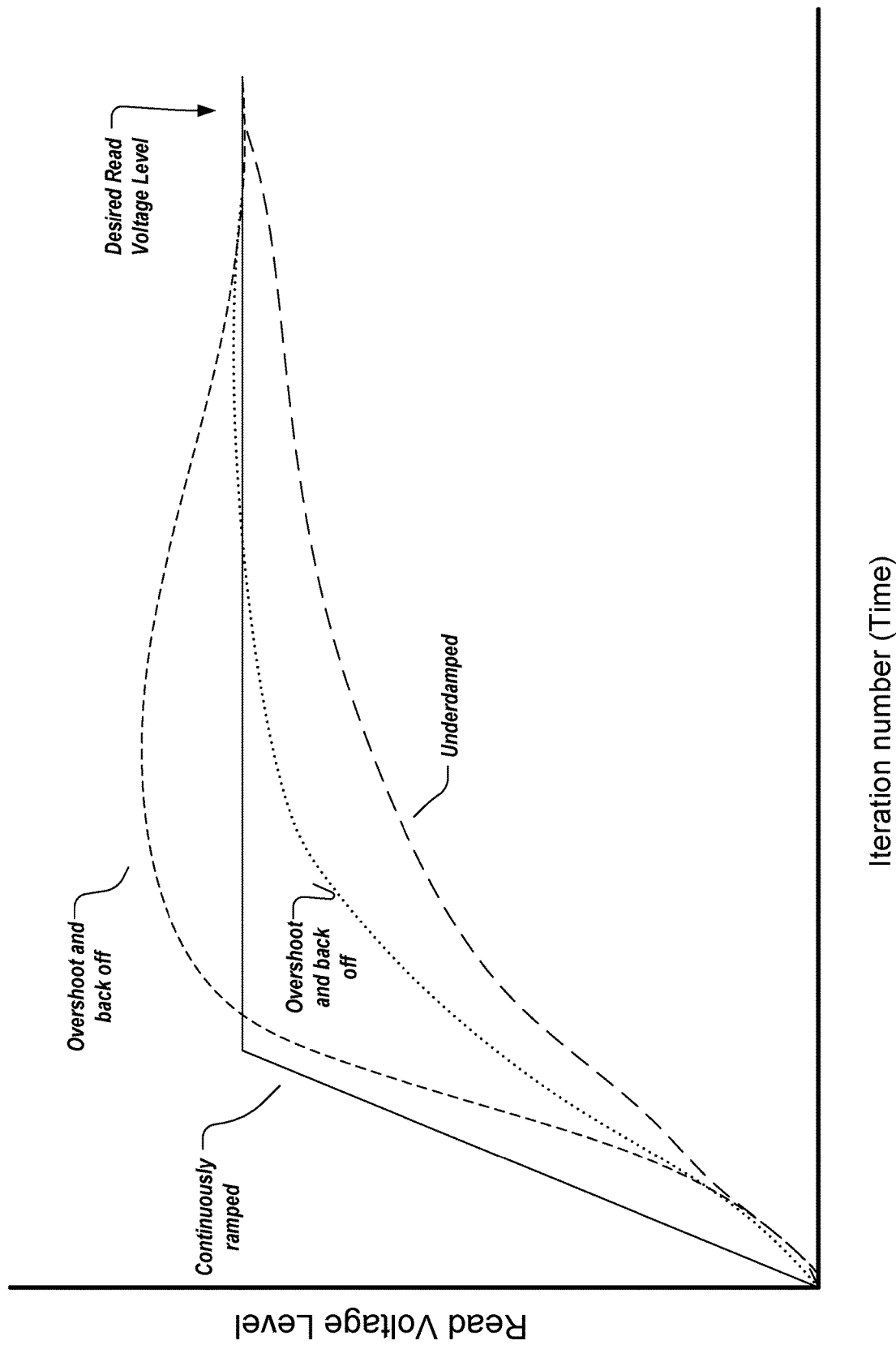
FIG. 6 is a graph illustrating various techniques that can be used by the read level adjustment component to adjust an applied read voltage level to lock in on a desired read voltage level in view of a comparison of a measured value of programmed bits and a target value of programmed bits.

FIG. 6 is a graph illustrating various techniques that can be used by the read level adjustment component to adjust an applied read voltage level to lock in on a desired read voltage level (e.g., a read voltage level that produces a measured value of programmed bits that is substantially equal to a target value of programmed bits). As shown in FIG. 6, in an embodiment, the read level adjustment component can ramp the read voltage level applied to the word line, where the summation function iteratively sampling the measured value of programmed bits and locking in on a read voltage level upon determining the measured value of programmed bits is substantially equal to the target value of programmed bits. In an embodiment, the read voltage level can be overdriven by the read level adjustment component to overshoot or saturate the read voltage level and then back off from the saturation to determine the desired read voltage level (e.g., the read voltage level that results in the measured value of programmed bits being substantially equal to the target value of programmed bits). In an embodiment, the read level adjustment component can adjust the read voltage level to approach a convergence point, without overdriving (e.g., underdamping) depending on the characteristics of the memory device and above-described feedback system.

According to embodiments of the present application, setting the read voltage level in view of a target number of programmed bits enables significant common mode rejection with disturb mechanisms like a change in array condition from a program state (e.g., transient VT), read disturb, program disturb, data retention, thermal correction, etc. In particular, the systems and methods describe herein are useful to address charge loss expected on a replacement gate memory device (e.g., NAND device).

In addition, the read voltage adjustment component and corresponding functionality reduces chip complexity and time to market in view of the dynamic adjustments and internal monitoring of the read voltage level. Accordingly, a memory device including the read voltage adjustment component employs an internal signal to determine an optimized or desired read point. This enables the memory device to dynamically adjust to shifted or disturbed data.

Advantageously, to read an intermediate state, the memory device can adjust or drive to the target value of programmed bits and latch in the read. The systems and methods described herein compensate for the differences in placements and return the correct data. In addition, read retry paths are shortened by the read level adjustment component because an internally provided signal is actively used to determine valley locations (e.g., mitigating the need to execute a second read in response to inaccurate initial read level offsets). As such, specific offsets for data retention or cross temp would not be needed.

In addition, the systems and methods described herein remove constraints on placement distributions at a same point for all word lines. Since the read process is keying off an internal signal, substantial variation in valley location can be targeted without adverse effects on trigger rate. This creates an additional flexibility when creating the read window budget. In an embodiment, the read voltage levels can be tuned specific to each memory cell being read.

Figure 7:
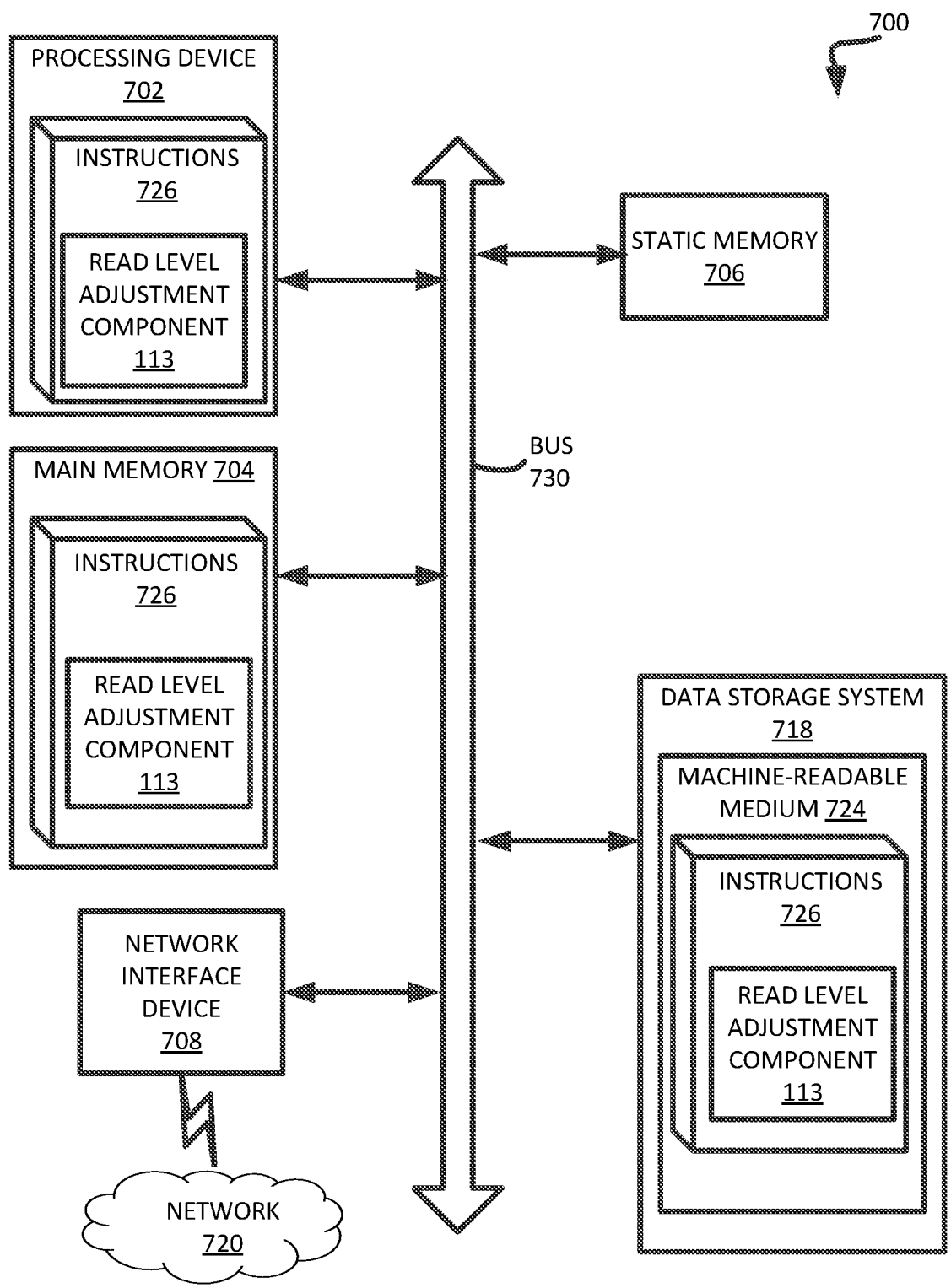
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a read level adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a data protection component (e.g., the read level adjustment component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    establishing, by a processing device, a target value of programmed bits for each programming distribution of a set of programming distributions of a memory sub-system, wherein the target value of programmed bits for a first programming distribution comprises a target ratio of a first number of programmed bits in the first programming distribution to a second number of erased bits;
    applying a read voltage level to determine a measured value of programmed bits in one or more programming distributions of the set of programming distributions;
    comparing the target value of programmed bits to the measured value of programmed bits to determine a comparison result; and
    executing an action in view of the comparison result.

2. The method of claim 1, wherein the comparison result indicates the measured value of programmed bits is substantially equal to the target value of programmed bits; and wherein the action comprises executing a read operation using the read voltage level.

3. The method of claim 1, wherein the comparison result indicates the measured value of programmed bits is greater than the target value of programmed bits; and wherein the action comprises decreasing the read voltage level to an adjusted read voltage level.

4. The method of claim 3, further comprising:
    applying the adjusted read voltage level to determine an updated measured value of programmed bits;
    comparing the updated measure value of programmed bits to the target value of programmed bits to determine an updated comparison result, wherein the updated comparison result indicates the updated measured value of programmed bits is substantially equal to the target value of programmed bits; and executing a subsequent action in view of the updated comparison result, wherein the subsequent action comprises executing a read operation using the adjusted read voltage level.

5. The method of claim 1, wherein the comparison result indicates the measured value of programmed bits is less than the target value of programmed bits; and wherein the action comprises increasing the read voltage level to an adjusted read voltage level.

6. The method of claim 5, further comprising:

applying the adjusted read voltage level to determine an updated measured value of programmed bits; and comparing the updated measured value of programmed bits to the target value of programmed bits to determine an updated comparison result, wherein the updated comparison result indicates the updated measured value of programmed bits is substantially equal to the target value of programmed bits; and executing a subsequent action in view of the updated comparison result, wherein the subsequent action comprises executing a read operation using the adjusted read voltage level.

7. The method of claim 1, wherein a summation function is executed to determine a count of programmed bits corresponding to the one or more programming distributions in view of the read voltage level.

8. A non-transitory computer readable medium comprising instructions, which when executed by a processing device, cause the processing device to perform operations comprising:

establishing, by a processing device, a target value of programmed bits for a set of programming distributions of a memory sub-system, wherein the target value of programmed bits comprises a substantially equal number of programmed bits for each programming distribution of the set of programming distributions;

applying a first read voltage level to a word line portion of the memory sub-system;

executing a summation function to determine a cumulative count of programmed bits in one or more programming distributions corresponding to the first read voltage level;

determining a measured value of programmed bits in view of the cumulative count of programmed bits;

comparing the target value of programmed bits to the measured value of programmed bits to determine a comparison result;

setting an adjusted read voltage level in view of the comparison result; and applying the adjusted read voltage level to the word line portion of the memory sub-system.

9. The non-transitory computer readable medium of claim 8, wherein the adjusted read voltage level is generated by decreasing the first read voltage level in response to the comparison result indicating the measured value of programmed bits is greater than the target value of programmed bits.

10. The non-transitory computer readable medium of claim 8, wherein the adjusted read voltage level is generated by increasing the first read voltage level in response to the comparison result indicating the measured value of programmed bits is less than the target value of programmed bits.

11. The non-transitory computer readable medium of claim 8, the operations further comprising:

determining an updated measured value of programmed bits in view of an updated cumulative count of programmed bits corresponding to the adjusted read voltage level.

12. The non-transitory computer readable medium of claim 8, wherein the target value of programmed bits for a first programming distribution comprises a target ratio of a first number of programmed bits in the first programming distribution to a second number of erased bits.

13. A system comprising:

a memory device; and a processing device, operatively coupled with the memory device, to perform operations comprising:

establishing a target value of programmed bits for each programming distribution of a set of programming distributions of a memory sub-system, wherein the target value of programmed bits for a first programming distribution comprises a target ratio of a first number of programmed bits in the first programming distribution to a second number of erased bits;

applying a read voltage level to determine a measured value of programmed bits in one or more programming distributions of the set of programming distributions;

comparing the target value of programmed bits to the measured value of programmed bits to determine a comparison result; and executing an action in view of the comparison result.

14. The system of claim 13, wherein the comparison result indicates the measured value of programmed bits is substantially equal to the target value of programmed bits; and wherein the action comprises executing a read operation using the read voltage level.

15. The system of claim 13, wherein the comparison result indicates the measured value of programmed bits is greater than the target value of programmed bits; and wherein the action comprises decreasing the read voltage level to an adjusted read voltage level.

16. The system of claim 15, the operations further comprising:

applying the adjusted read voltage level to determine an updated measured value of programmed bits;

comparing the updated measure value of programmed bits to the target value of programmed bits to determine an updated comparison result, wherein the updated comparison result indicates the updated measured value of programmed bits is substantially equal to the target value of programmed bits; and executing a subsequent action in view of the updated comparison result, wherein the subsequent action comprises executing a read operation using the adjusted read voltage level.

17. The system of claim 13, wherein the comparison result indicates the measured value of programmed bits is less than the target value of programmed bits; and wherein the action comprises increasing the read voltage level to an adjusted read voltage level.

18. The system of claim 17, the operations further comprising:

applying the adjusted read voltage level to determine an updated measured value of programmed bits;

comparing the updated measured value of programmed bits to the target value of programmed bits to determine an updated comparison result, wherein the updated comparison result indicates the updated measured value of programmed bits is substantially equal to the target value of programmed bits; and executing a subsequent action in view of the updated comparison result, wherein the subsequent action comprises executing a read operation using the adjusted read voltage level.

* * * * *